(12) United States Patent
Cho et al.

(10) Patent No.: US 11,335,713 B2
(45) Date of Patent: May 17, 2022

(54) DISPLAY DEVICE

(71) Applicant: SAMSUNG DISPLAY CO., LTD., Yongin-si (KR)

(72) Inventors: Young Jin Cho, Seoul (KR); Joong-Soo Moon, Hwaseong-si (KR); Min Woo Byun, Seongnam-si (KR); Yang Wan Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 142 days.

(21) Appl. No.: 16/794,981

(22) Filed: Feb. 19, 2020

(65) Prior Publication Data

US 2020/0303421 A1    Sep. 24, 2020

(30) Foreign Application Priority Data

Mar. 22, 2019    (KR) .................. 10-2019-0033123

(51) Int. Cl.
| | |
|---|---|
| *H01L 27/12* | (2006.01) |
| *H01L 29/786* | (2006.01) |
| *H01L 27/32* | (2006.01) |
| *H05K 1/14* | (2006.01) |
| *G09G 3/3258* | (2016.01) |
| *G09G 3/3275* | (2016.01) |

(52) U.S. Cl.
CPC ......... *H01L 27/124* (2013.01); *G09G 3/3258* (2013.01); *G09G 3/3275* (2013.01); *H01L 27/1218* (2013.01); *H01L 27/1225* (2013.01); *H01L 27/3262* (2013.01); *H01L 27/3276* (2013.01); *H01L 29/7869* (2013.01); *H01L 29/78675* (2013.01); *H01L 29/78696* (2013.01); *H05K 1/147* (2013.01); *H01L 27/1255* (2013.01); *H01L 27/3265* (2013.01); *H05K 2201/10128* (2013.01)

(58) Field of Classification Search
CPC .............. H01L 27/124; H01L 27/1218; H01L 27/1225; H01L 27/3262; H01L 27/3276; H01L 29/78675; H01L 29/7869; G09G 3/3258
USPC ................ 257/43, 40; 438/82, 85, 86, 99
See application file for complete search history.

(56) References Cited

U.S. PATENT DOCUMENTS

| | | | |
|---|---|---|---|
| 9,786,229 B2 | 10/2017 | Lee et al. | |
| 2008/0024056 A1* | 1/2008 | Sung et al. | ......... H01L 27/3276 313/504 |
| 2018/0240941 A1 | 8/2018 | Li et al. | |

FOREIGN PATENT DOCUMENTS

| | | |
|---|---|---|
| KR | 10-2017-6102131 | 9/2017 |
| KR | 10-2017-6105683 | 9/2017 |
| KR | 10-2018-0047384 | 5/2018 |

* cited by examiner

*Primary Examiner* — Thinh T Nguyen

(74) *Attorney, Agent, or Firm* — F. Chau & Associates, LLC

(57) ABSTRACT

A display device includes a substrate including a display area and a non-display area, a reference voltage supply line disposed in the non-display area and transmitting a reference voltage, and a driving voltage supply line disposed in the non-display area and transmitting a driving voltage. The reference voltage supply line includes a straight line part extending in a first direction and a curved line part extending from the straight line part to be bent, and the curved line part of the reference voltage supply line is disposed along a periphery of the display area.

9 Claims, 8 Drawing Sheets

DISPLAY DEVICE

CROSS-REFERENCE TO RELATED APPLICATION

This application claims priority under 35 U.S.C. § 119 to Korean Patent Application No. 10-2019-0033123, filed in the Korean Intellectual Property Office on Mar. 22, 2019, the disclosure of which is incorporated by reference herein in its entirety.

TECHNICAL FIELD

Exemplary embodiments of the inventive concept relate to a display device having overlapping semiconductor layers.

DISCUSSION OF RELATED ART

Recently, display devices such as organic light emitting diode (OLED) displays and liquid crystal display devices have been increasingly used. OLED displays have a self-luminescent characteristic. An OLED of the OLED display includes two electrodes and an organic emission layer interposed therebetween, where electrons injected from one electrode (e.g., a cathode) and holes injected from the other electrode (e.g., an anode) are combined in the organic emission layer to generate excitons, and the excitons release energy to emit light.

In addition to the self-luminescent characteristic such that a separate light source is not required, OLED displays have high luminance and low operating voltage characteristics, and have an unlimited viewing angle.

SUMMARY

According to an exemplary embodiment of the inventive concept, a display device includes a substrate including a display area and a non-display area, a reference voltage supply line disposed in the non-display area and transmitting a reference voltage, and a driving voltage supply line disposed in the non-display area and transmitting a driving voltage. The reference voltage supply line includes a straight line part extending in a first direction and a curved line part extending from the straight line part to be bent, and the curved line part of the reference voltage supply line is disposed along a periphery of the display area.

The display device may further include a reference voltage connection line extending from the reference voltage supply line in a second direction crossing the first direction, and a reference voltage line extending in the display area in the second direction. The reference voltage line may be electrically connected to the reference voltage connection line through an opening.

The display device may further include a driving voltage connection line extending from the driving voltage supply line in the second direction, and a driving voltage line extending in the display area in the second direction. The driving voltage line may be electrically connected to the driving voltage connection line through an opening.

The display device may further include an oxide semiconductor transistor including an oxide semiconductor layer and a polycrystalline semiconductor transistor including a polycrystalline semiconductor layer.

The display device may further include a driving transistor. The driving transistor may be the oxide semiconductor transistor, and a gate electrode of the driving transistor may be disposed on the same layer as the reference voltage supply line.

The display device may further include a flexible printed circuit substrate connected to the substrate. The reference voltage supply line and the driving voltage supply line may be disposed between the flexible printed circuit substrate and the display area.

The display device may further include a gate driver disposed in the non-display area, an initialization voltage supply line extending in the non-display area in the second direction, a gate signal output terminal connected to the gate driver, and a gate signal connection line connected to the gate signal output terminal through an opening. The initialization voltage supply line may be disposed on the same layer as the gate signal connection line.

Pixels adjacent to the curved line part of the reference voltage supply line may be arranged in a stepped shape.

The gate driver and the driving voltage supply line may be bent in the same direction as the curved line part of the reference voltage supply line in a region adjacent to the curved line part of the reference voltage supply line.

According to an exemplary embodiment of the inventive concept, a display device includes a substrate including a display area and a non-display area, a buffer layer disposed on the substrate, a polycrystalline semiconductor layer disposed on the buffer layer, a lower gate insulating layer and a lower gate conductive layer disposed on the polycrystalline semiconductor layer, an oxide semiconductor layer disposed on the lower gate insulating layer, an upper gate insulating layer disposed on the oxide semiconductor layer, an upper gate conductive layer disposed on the upper gate insulating layer, an interlayer insulating layer disposed on the upper gate conductive layer, and a first data conductive layer disposed on the interlayer insulating layer. The upper gate conductive layer includes a reference voltage supply line and a reference voltage connection line disposed in the non-display area and transmitting a reference voltage, and a gate electrode of a driving transistor disposed in the display area.

The first data conductive layer may include a driving voltage supply line and a driving voltage connection line transmitting a driving voltage in the non-display area.

The reference voltage supply line may include a straight line part extending in a first direction in a plan view and a curved line part extending from the straight line part to be bent.

The lower gate insulating layer may include a first gate insulating layer and a second gate insulating layer which is disposed on the lower gate conductive layer, and the lower gate conductive layer may include an initialization voltage line transmitting an initialization voltage and a light emitting control line transmitting a light emitting control signal.

The upper gate conductive layer may further include a gate line transmitting a gate signal, a voltage control line transmitting a voltage control signal, and an initialization control line transmitting an initialization control signal.

The oxide semiconductor layer may include a first oxide semiconductor layer and a second oxide semiconductor layer which are separated on the same layer.

The display device may further include a second transistor, a third transistor, and a fourth transistor. The second transistor may include a channel disposed in the second oxide semiconductor layer overlapping the gate line, a first electrode of the second transistor may be connected to a data line transmitting a data voltage, the third transistor may include a channel disposed in the second oxide semiconductor layer overlapping the voltage control line, the fourth transistor may include a channel disposed in the first oxide semiconductor layer overlapping the initialization control line, and a first electrode of the fourth transistor may be connected to the initialization voltage line.

The display device may further include a fifth transistor, the fifth transistor may include a channel disposed in the polycrystalline semiconductor layer overlapping the light emitting control line, and a first electrode of the fifth transistor may be connected to a driving voltage line transmitting the driving voltage.

The display device may further include a reference voltage line transmitting the reference voltage in the display area, and the first data conductive layer may include the reference voltage line.

The display device may further include a passivation layer disposed on the first data conductive layer, and a second data conductive layer disposed on the passivation layer. The second data conductive layer may include a gate signal connection line disposed in the non-display area and transmitting the gate signal from a gate driver, and the data line.

The polycrystalline semiconductor layer and the first oxide semiconductor layer may be electrically connected through a connection member.

According to an exemplary embodiment of the inventive concept, a display device includes a rounded area, where the rounded area includes a display area and a non-display area. The rounded area includes pixels arranged in a stepped shape and disposed in the display area, a gate driver having a curved form in the non-display area and including a plurality of stages that are dependently connected, arranged along a circumference of the rounded area, and configured to transmit a gate signal to the pixels, an initialization voltage supply line having a curved form in the non-display area, and configured to transmit an initialization voltage to the pixels, a driving voltage supply line having a curved form in the non-display area, and configured to transmit a driving voltage to the pixels, and a reference voltage supply line having a curved form in the non-display area, and configured to transmit a reference voltage to the pixels.

DETAILED DESCRIPTION OF THE EMBODIMENTS

Figure 1:
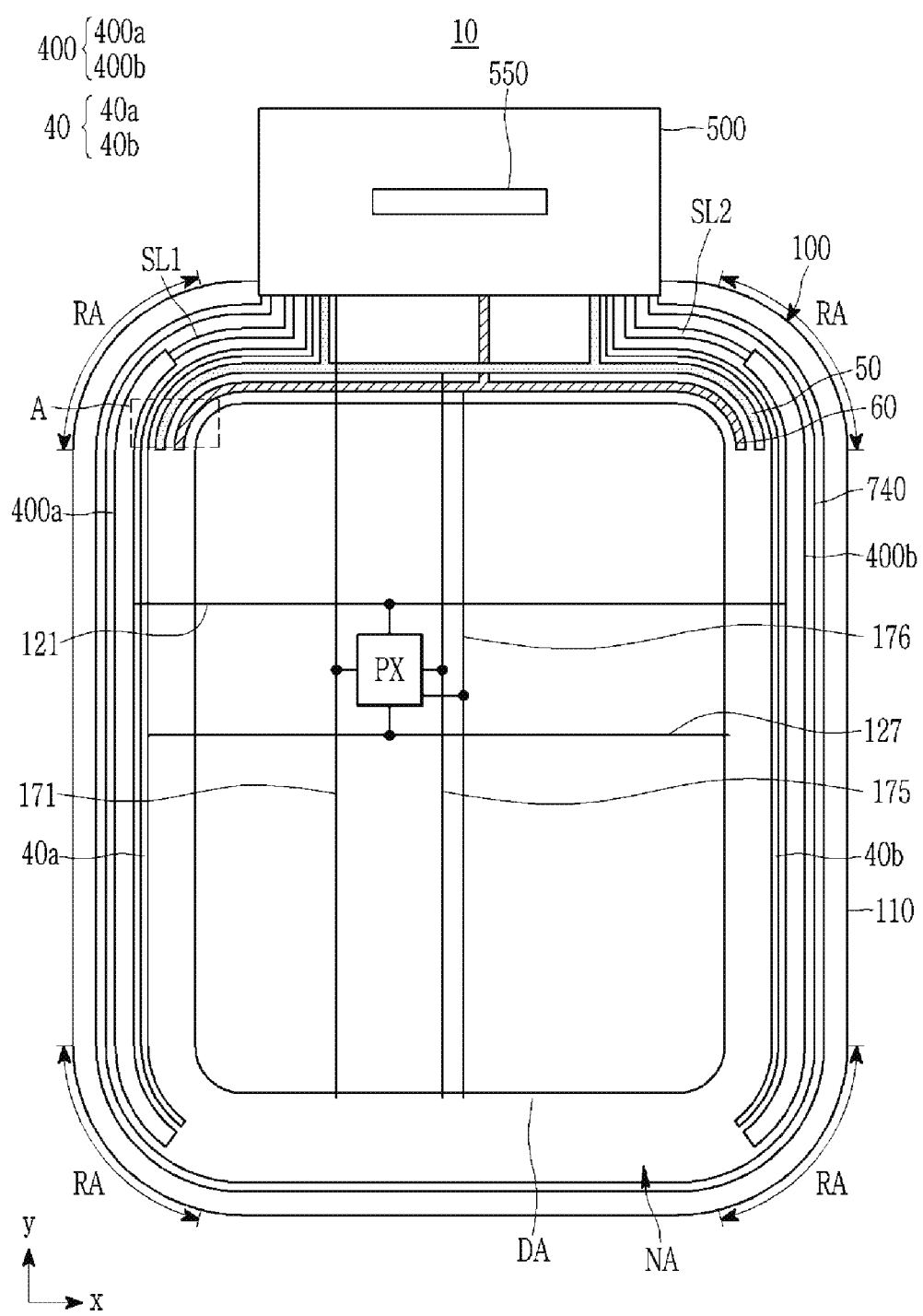
FIG. 1 is a schematic top plan view of a display device according to an exemplary embodiment of the inventive concept.

Exemplary embodiments provide a display device of which luminance uniformity is maintained without luminance deterioration of some pixels and of which display quality is improved.

Exemplary embodiments of the inventive concept will be described more fully hereinafter with reference to the accompanying drawings. Like reference numerals may refer to like elements throughout this application.

Further, in the drawings, a size and thickness of each element are arbitrarily represented for better understanding and ease of description, and the inventive concept is not limited thereto. Additionally, the thickness of layers, films, panels, regions, areas, etc., may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below an object portion, and does not necessarily mean positioned on the upper side of the object portion based on a gravitational direction.

Further, throughout the specification, the phrase "plan view" means viewing a target portion from the top, and the phrase "cross-sectional view" means viewing a cross-section formed by vertically cutting a target portion from the side.

FIG. 1 is a schematic top plan view of a display device according to an exemplary embodiment of the inventive concept. Referring to FIG. 1, a display device 10 includes a display panel 100 and a flexible printed circuit substrate 500.

The display panel 100 includes a substrate 110. The substrate 110 may be a flexible substrate that can be bent or twisted. The edge of the substrate 110 has a round arc shape. In other words, the edge of the substrate 110 is a smooth curved line. The substrate 110 includes a display area DA for displaying an image and a non-display area NA for the remaining regions. Additionally, the substrate 110 includes a rounded area RA where the rounded edge is disposed. However, it is not limited thereto, and the rounded area RA may be a region where the edge of the display area DA is a curved line regardless of the shape of the substrate 110.

A plurality of signal lines and a pixel PX connected to the plurality of signal lines are disposed in the display area DA. The plurality of signal lines includes a gate line 121, an initialization voltage line 127, a data line 171, a driving voltage line 175, and a reference voltage line 176. The pixel PX is a minimum unit representing an image, and the display device 10 may display the image through the pixel PX.

The gate line 121 and the initialization voltage line 127 extend in a first direction x in the display area DA. The gate line 121 transmits a gate signal, and the initialization voltage line 127 transmits an initialization voltage. The data line 171, the driving voltage line 175, and the reference voltage line 176 extend in a second direction y in the display area DA. The data line 171 transmits a data voltage corresponding to an image signal, the driving voltage line 175 transmits a driving voltage, and the reference voltage line 176 transmits a reference voltage.

A common voltage supply line 740, a gate driver 400, an initialization voltage supply line 40, a driving voltage supply line 50, and a reference voltage supply line 60 are disposed in the non-display area NA.

The common voltage supply line 740 is disposed along the edge of the substrate 110 and applies a common voltage to the pixel PX.

The gate driver 400 receives a gate control signal to generate the gate signal. The gate driver 400 is connected to the gate line 121 to transfer the gate signal to the pixel PX through the gate line 121. The gate driver 400 may be formed directly in the non-display area NA of the display panel 100 through the same process along with an electrical device such as a thin film transistor in the display area DA.

The gate driver 400 includes a first gate driver 400*a* and a second gate driver 400*b* respectively disposed on two sides of the non-display area NA with respect to the display area DA. However, it is not limited thereto, and the gate driver 400 may be disposed on only one side with respect to the display area DA. The first gate driver 400*a* is connected to a plurality of first control signal lines SL1 to receive gate control signals, and the second gate driver 400*b* is connected to a plurality of second control signal lines SL2 to receive gate control signals.

The first gate driver 400*a* and the second gate driver 400*b* extend in the second direction y on respective sides of the non-display area NA and extend to the rounded area RA. In the rounded area RA, the first gate driver 400*a* and the second gate driver 400*b* may be bent along the periphery of the display area DA. Accordingly, they may be connected to the pixels PX via both ends of the gate line 121.

The first gate driver 400*a* and the second gate driver 400*b* may include a plurality of stages ST arranged in the second direction y, and the detailed description thereof is provided below.

The initialization voltage supply line 40 includes a first initialization voltage supply line 40*a* disposed on one side of the non-display area NA and a second initialization voltage supply line 40*b* disposed on the other side of the non-display area NA. However, it is not limited thereto, and the initialization voltage supply line 40 may be disposed on only one side of the display area DA.

The first initialization voltage supply line 40*a* and the second initialization voltage supply line 40*b* extend in the second direction y on respective sides of the non-display area NA and extend to the rounded area RA, and the initialization voltage supply line 40 is connected to the initialization voltage line 127 to transmit the initialization voltage. The initialization voltage supply line 40 may be disposed between the gate driver 400 and the display area DA. In detail, the first initialization voltage supply line 40*a* is disposed between the first gate driver 400*a* and the display area DA, and the second initialization voltage supply line 40*b* is disposed between the second gate driver 400*b* and the display area DA. However, the position of the initialization voltage supply line 40 is not limited thereto.

The driving voltage supply line 50 is disposed on one side of the substrate 110 on which the flexible printed circuit substrate 500 is disposed, and extends in the first direction x. In addition, the driving voltage supply line 50 extends along the edge of the substrate 110 or the edge of display area DA, and is also disposed in the rounded area RA. Both ends of the driving voltage supply line 50 have a rounded and curved line shape, and the driving voltage supply line 50 forms a loop with one open side. In other words, the driving voltage supply line 50 includes a straight line part extending straight on a plane and a curved line part disposed at both ends of the straight line part. The curved line part is disposed in the rounded area RA. The driving voltage supply line 50 is disposed along the periphery of the display area DA, thus being disposed along the rounded corner of the display area DA. The driving voltage supply line 50 is connected to the driving voltage line 175 to transmit the driving voltage. Both ends of the straight line part of the driving voltage supply line 50 include the curved line part; however it is possible to include the curved line part at only one end of the straight line part of the driving voltage supply line 50.

The reference voltage supply line 60 is disposed on one side of the substrate 110 where the flexible printed circuit substrate 500 is disposed, and extends in the first direction x. The reference voltage supply line 60 may be substantially parallel to the driving voltage supply line 50. In addition, the reference voltage supply line 60 extends along the edge of the substrate 110 or the edge of the display area DA, and is also disposed in the rounded area RA. Both ends of the reference voltage supply line 60 have the rounded and curved line shape, and the reference voltage supply line 60 forms a loop with one side open. In other words, the reference voltage supply line 60 includes a straight line part extending in a straight line and a curved line part disposed at both ends of the straight line part. The curved line part is disposed in the rounded area RA. The reference voltage supply line 60 is disposed along the periphery of the display area DA, thus being disposed along the rounded corner of the display area DA. The reference voltage supply line 60 is connected to the reference voltage line 176 to transmit the reference voltage. It is also possible to provide the curved line part at only one end of the straight line part of the reference voltage supply line 60, even though it has been described as providing the curved line part at both ends of the straight line part of the reference voltage supply line 60.

The flexible printed circuit substrate 500 may be bent, and one end of the flexible printed circuit substrate 500 is electrically connected to a plurality of signal lines of the display panel 100. The flexible printed circuit substrate 500 includes a data driver IC 550 that generates the data voltage that is a gray voltage corresponding to the input image signal. The data voltage generated from the data driver IC 550 is transferred to the data line 171 of the display panel 100. However, unlike what is shown, the data driver may instead be mounted in the non-display area NA of the display panel 100 in a form of an integrated circuit chip.

The rounded area RA of the display device according to an exemplary embodiment of the inventive concept is now described in detail with reference to FIG. 2 to FIG. 4.

Figure 2:
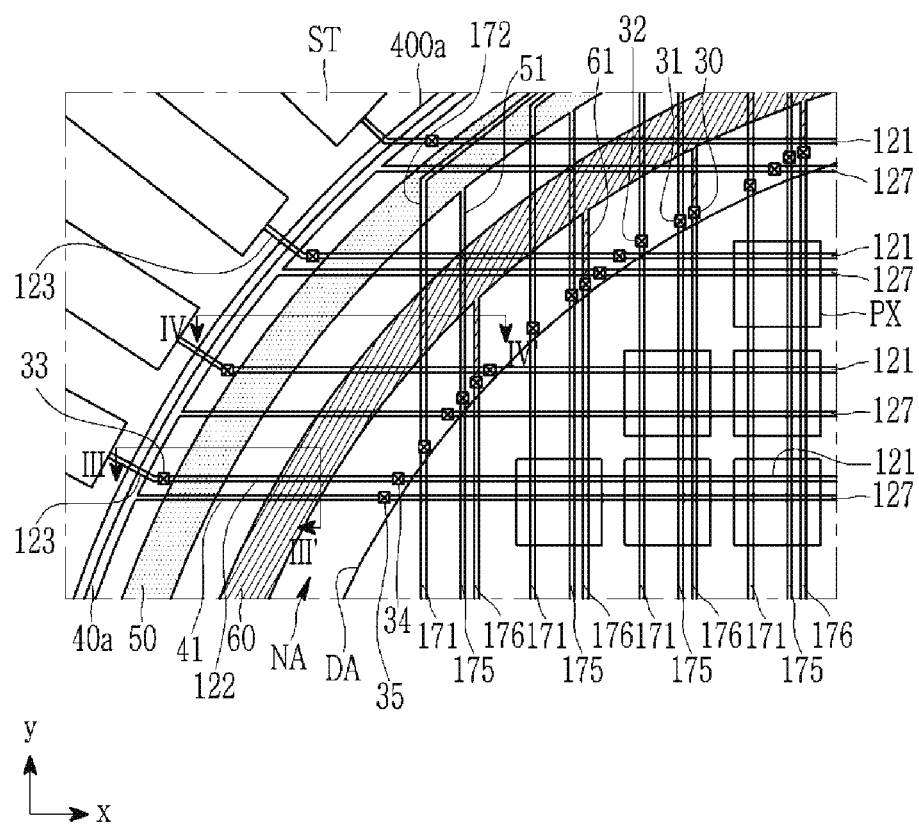
FIG. 2 is an enlarged top plan view of a region A of FIG. 1 according to an exemplary embodiment of the inventive concept.

FIG. 2 is an enlarged top plan view of a region A of FIG. 1 according to an exemplary embodiment of the inventive concept.

The pixels PX disposed in the rounded area RA of the display device according to an exemplary embodiment may be arranged with a stepped shape. However, the arrangement shape of the pixels PX is not limited to as shown in FIG. 2. In FIG. 2, the pixels PX are arranged in a line in the first direction x and the second direction y. However, the arrangement of the pixels PX is not limited thereto, and the pixels PX may be differently arranged.

The first gate driver 400*a* of the non-display area NA includes the plurality of stages ST. The plurality of stages ST may be arranged in a line along a direction in which the first gate driver 400*a* extends. In other words, the plurality of stages ST may be arranged along a circumference of the rounded area RA. The plurality of stages STs may be dependently connected. The plurality of stages ST may receive the gate control signal through the first control signal line SL1 of FIG. 1 to sequentially generate the gate signal.

A gate signal output terminal 123 connected to the stages ST, and a gate signal connection line 122 connected to the gate signal output terminal 123 through an opening 33, are disposed in the non-display area NA. The gate signal generated from the stages ST is transmitted to the gate signal output terminal 123 and then is transmitted to the gate signal connection line 122.

The gate signal connection line 122 and the gate line 121 disposed in the display area DA are connected through an opening 34. Accordingly, the gate signal transferred to the gate signal connection line 122 is transferred to the gate line 121. The opening 34 in which the gate signal connection line 122 and the gate line 121 are connected may be disposed in the non-display area NA adjacent to the display area DA; however, it is also possible for the opening 34 to be disposed in the display area DA.

The first initialization voltage supply line 40a is bent in a curved line form in the rounded area RA. The first initialization voltage supply line 40a is connected to an initialization voltage connection line 41 extending in the first direction x. The initialization voltage connection line 41 may be a part extending in the first direction x from the initialization voltage supply line 40. In other words, the initialization voltage supply line 40 and the initialization voltage connection line 41 may be disposed on the same layer. The initialization voltage connection line 41 is connected to the initialization voltage line 127 through an opening 35. Thus, the initialization voltage may be transferred to the initialization voltage line 127 through the initialization voltage supply line 40 and the initialization voltage connection line 41.

The opening 35 where the initialization voltage connection line 41 and the initialization voltage line 127 are connected may be disposed in the non-display area NA adjacent to the display area DA; however, it is not limited thereto, and the opening 35 may be disposed within the display area DA. The first initialization voltage supply line 40a, the initialization voltage connection line 41, and the gate signal connection line 122 may all be disposed on the same layer.

The driving voltage supply line 50 is disposed and bent in a curved line form in the rounded area RA. The driving voltage supply line 50 is connected with a driving voltage connection line 51 extending in the second direction y. The driving voltage connection line 51 may be a portion extending from the driving voltage supply line 50 in the second direction y. In other words, the driving voltage supply line 50 and the driving voltage connection line 51 may be disposed on the same layer. The driving voltage connection line 51 is connected to the driving voltage line 175 through an opening 31. Thus, the driving voltage may be transmitted to the driving voltage line 175 via the driving voltage supply line 50 and the driving voltage connection line 51. The opening 31, in which the driving voltage supply line 50 and the driving voltage connection line 51 are connected, may be disposed in the non-display area NA adjacent to the display area DA. However, it is not limited thereto, and it is possible for the opening 31 to be disposed in the display area DA.

The reference voltage supply line 60 is disposed to be bent in a curved line form in the rounded area RA. The reference voltage supply line 60 is connected to a reference voltage connection line 61 extending in the second direction y. The reference voltage connection line 61 may be a portion extending from the reference voltage supply line 60 in the second direction y. In other words, the reference voltage supply line 60 and the reference voltage connection line 61 may be disposed on the same layer. The reference voltage connection line 61 is connected to the reference voltage line 176 through an opening 30. Thus, the reference voltage may be transferred to the reference voltage line 176 through the reference voltage supply line 60 and the reference voltage connection line 61. The opening 30, in which the reference voltage supply line 60 and the reference voltage connection line 61 are connected, may be disposed in a non-display area NA adjacent to the display area DA; however it is not limited thereto, and it is possible for the opening 30 to be disposed in the display area DA.

One end of a data voltage connection line 172 is electrically connected to the flexible printed circuit substrate 500, and the other end is connected to the data line 171 disposed in the display area DA through an opening 32. The data voltage generated at the data driver IC 550 may be transferred to the pixel PX via the data voltage connection line 172 and the data line 171.

Figure 3:
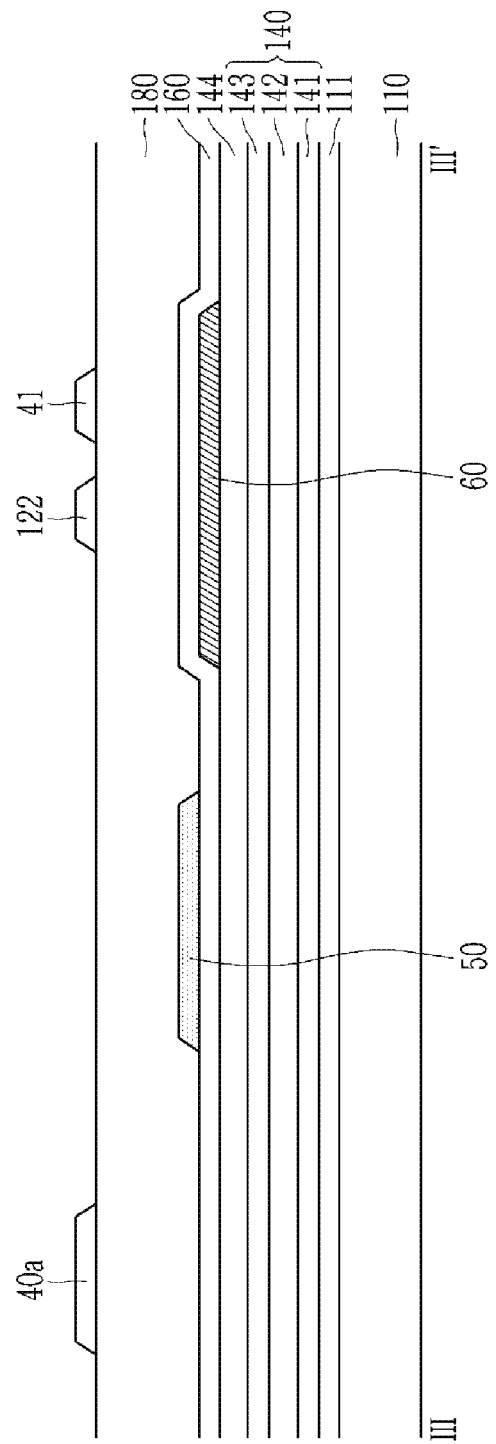
FIG. 3 is a cross-sectional view taken along a line III-III' of FIG. 2 according to an exemplary embodiment of the inventive concept.

FIG. 3 is a cross-sectional view taken along a line of FIG. 2 according to an exemplary embodiment of the inventive concept.

Referring to FIG. 3, a buffer layer 111, a lower gate insulating layer 140, and an upper gate insulating layer 144 are disposed on the substrate 110. The lower gate insulating layer 140 includes a first gate insulating layer 141, a second gate insulating layer 142, and a third gate insulating layer 143 that are sequentially stacked. Hereinafter, the upper gate insulating layer 144 is referred to as a fourth gate insulating layer 144.

The reference voltage supply line 60 is disposed on the fourth gate insulating layer 144. The reference voltage connection line 61 may be disposed on the same layer as a third gate conductive layer (also referred to as an upper gate conductive layer) described later.

An interlayer insulating layer 160 is disposed on the reference voltage supply line 60. The interlayer insulating layer 160 may include an inorganic insulating material such as a silicon nitride, a silicon oxide, or a silicon oxynitride.

The driving voltage supply line 50 is disposed on the interlayer insulating layer 160. The driving voltage supply line 50 may be disposed on the same layer as a first data conductive layer described later.

A passivation layer 180 is disposed on the driving voltage supply line 50, and the first initialization voltage supply line 40a, the initialization voltage connection line 41, and the gate signal connection line 122 are disposed on the passivation layer 180. The first initialization voltage supply line 40a, the initialization voltage connection line 41, and the gate signal connection line 122 may be disposed on the same layer as a second data conductive layer described later.

Figure 4:
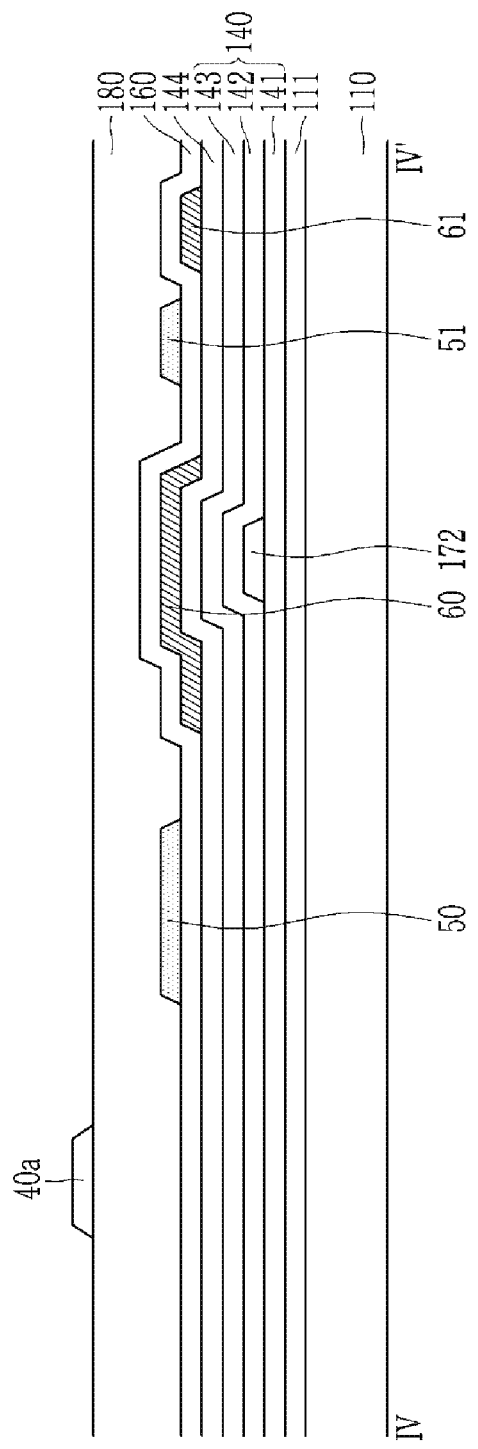
FIG. 4 is a cross-sectional view taken along a line IV-IV' of FIG. 2 according to an exemplary embodiment of the inventive concept.

FIG. 4 is a cross-sectional view taken along a line IV-IV' of FIG. 2 according to an exemplary embodiment of the inventive concept. Referring to FIG. 4, the buffer layer 111 is disposed on the substrate 110, and the first gate insulating layer 141 is disposed on the buffer layer 111.

The data voltage connection line 172 is disposed on the first gate insulating layer 141. The second gate insulating layer 142 and the third gate insulating layer 143 are sequentially disposed on the data voltage connection line 172. Although the data voltage connection line 172 is disposed on the first gate insulating layer 141, it is possible to dispose the data voltage connection line 172 on the second gate insulating layer 142.

The reference voltage supply line 60 and the reference voltage connection line 61 are disposed on the third gate insulating layer 143.

The interlayer insulating layer 160 is disposed on the reference voltage supply line 60 and the reference voltage connection line 61, and the driving voltage supply line 50 and the driving voltage connection line 51 are disposed on the interlayer insulating layer 160.

The passivation layer 180 is disposed on the driving voltage supply line 50 and the driving voltage connection line 51, and the first initialization voltage supply line 40a is disposed on the passivation layer 180.

The common voltage supply line 740, the gate driver 400, the initialization voltage supply line 40, the driving voltage supply line 50, and the reference voltage supply line 60 are disposed in the rounded area RA adjacent to the flexible printed circuit substrate 500. Additionally, connection wires for transmitting the signals from the common voltage supply line 740, the gate driver 400, the initialization voltage supply line 40, the driving voltage supply line 50, and the reference voltage supply line 60 to the display area DA are also disposed in the rounded area RA.

In the case of the display device according to a comparative example, because there are not enough layers to dispose both the voltage supply line and the connection wiring, it may be difficult to include the reference voltage supply line 60 in a design. Additionally, in the comparative example including the reference voltage supply line 60, since the reference voltage supply line 60 may not extend to the rounded area RA, the reference voltage supply line 60 includes only the straight line part excluding the rounded area RA. As a result, the reference voltage may not be supplied to the pixels PX disposed at both edges based on the first direction x, and some pixels PX to which the reference voltage is not supplied may have problems such as a luminance deterioration.

In the display device according to an exemplary embodiment of the inventive concept, the common voltage supply line 740, the gate signal connection line 122, the initialization voltage supply line 40, the driving voltage supply line 50, and the reference voltage supply line 60 may be disposed on different layers, and the reference voltage supply line 60 may be disposed in the rounded area RA.

In detail, since the reference voltage supply line 60 and the reference voltage connection line 61 are disposed between the fourth gate insulating layer 144 and the interlayer insulating layer 160, the reference voltage supply line 60 may extend to the rounded area RA. Therefore, it is possible to supply the reference voltage to all pixels PX in the display area DA, and luminance uniformity may be maintained without causing problems such as the luminance deterioration of some of the pixels PX.

Next, the pixel PX included in the display device according to an exemplary embodiment of the inventive concept is described with reference to FIG. 5 to FIG. 8.

Figure 5:
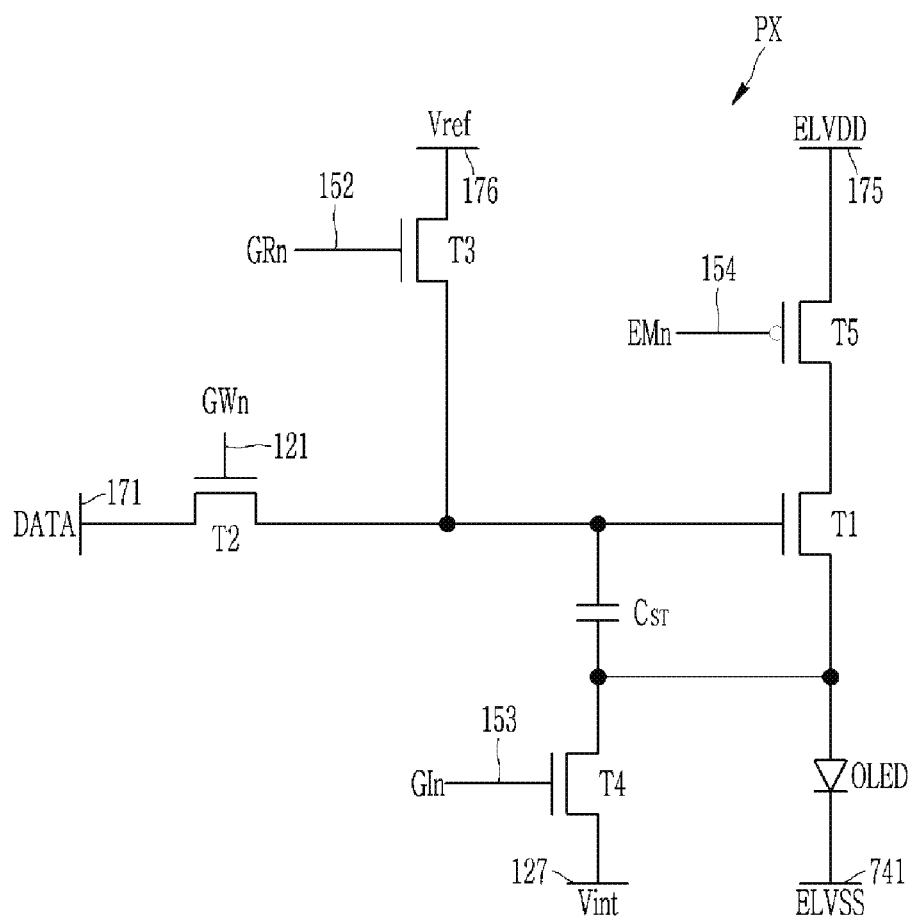
FIG. 5 is an equivalent circuit diagram of one pixel of a display device according to an exemplary embodiment of the inventive concept.
Figure 6:
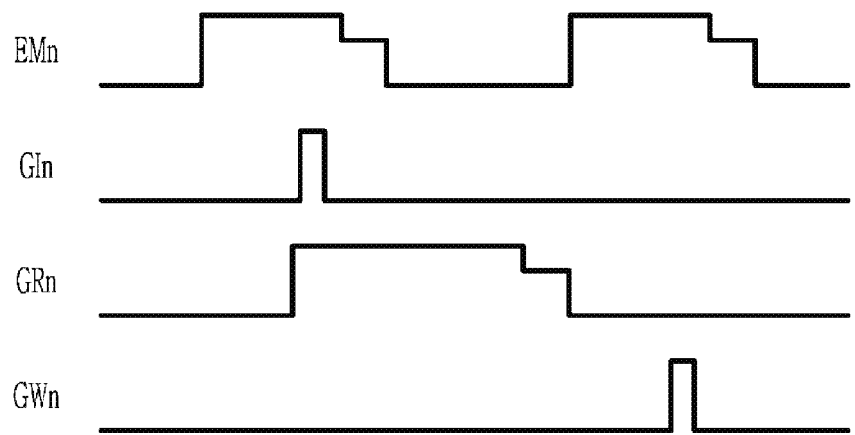
FIG. 6 is a timing diagram of signals applied to one pixel of a display device according to an exemplary embodiment of the inventive concept.

FIG. 5 is an equivalent circuit diagram of one pixel of a display device according to an exemplary embodiment of the inventive concept, and FIG. 6 is a timing diagram of signals applied to one pixel of a display device according to an exemplary embodiment of the inventive concept.

Referring to FIG. 5, the pixel PX of the display device according to an exemplary embodiment of the inventive concept includes a plurality of signal lines, and a plurality of transistors T1, T2, T3, T4, and T5, a storage capacitor Cst, and an organic light emitting diode OLED, which are connected thereto.

The plurality of signal lines includes the data line 171, the driving voltage line 175, the reference voltage line 176, the initialization voltage line 127, a common voltage line 741, the gate line 121, a voltage control line 152, an initialization control line 153, and a light emitting control line 154.

The data line 171 is a wire for transmitting a data voltage DATA generated from the data driver, and luminance emitted from the organic light emitting diode OLED changes according to the data voltage DATA applied to the pixel PX.

The driving voltage line 175 applies a driving voltage ELVDD, the reference voltage line 176 transmits a reference voltage Vref, the initialization voltage line 127 transmits an initialization voltage Vint for initializing a second storage electrode of the storage capacitor Cst, a second electrode of the driving transistor T1, and an anode of the organic light emitting diode OLED, and the common voltage line 741 applies a common voltage ELVSS to a cathode of the organic light emitting diode OLED. The voltage applied to the driving voltage line 175, the initialization voltage line 127, and the common voltage line 741 may be constant voltages.

Next, the plurality of transistors T1, T2, T3, T4, and T5 is described. The plurality of transistors T1, T2, T3, T4, and T5 includes a driving transistor T1 (referred to as a first transistor), a second transistor T2, a third transistor T3, a fourth transistor T4, and a fifth transistor T5.

The driving transistor T1 includes a gate electrode connected to a first storage electrode of the storage capacitor Cst, a first electrode connected to a second electrode of the fifth transistor T5, and a second electrode connected to the anode of the organic light emitting diode OLED. The gate electrode of the driving transistor T1 is also connected to the second electrode of the second transistor T2 and the second electrode of the third transistor T3. The second electrode of the driving transistor T1 is also connected to the second electrode of the fourth transistor T4 and the second storage electrode of the storage capacitor Cst. The driving transistor T1 outputs the driving current to the organic light emitting diode OLED according to the data voltage DATA stored in the storage capacitor Cst. The first electrode of the driving transistor T1 is connected to the driving voltage line 175 via the fifth transistor T5.

The second transistor T2 includes a gate electrode connected to the gate line 121, a first electrode connected to the data line 171, and a second electrode connected to the gate electrode of the driving transistor T1. The second electrode of the second transistor T2 is also connected to the second electrode of the third transistor T3 and the first storage electrode of the storage capacitor Cst. The second transistor T2 has an n-type transistor characteristic, and is turned on when a gate signal GWn of high voltage is applied to the gate electrode. When the second transistor T2 is turned on, the data voltage DATA supplied through the data line 171 may be transferred to the first storage electrode of the storage capacitor Cst and the gate electrode of the driving transistor T1.

The third transistor T3 includes a gate electrode connected to the voltage control line 152, a first electrode connected to the reference voltage line 176, and a second electrode connected to the gate electrode of the driving transistor T1. The second electrode of the third transistor T3 is also connected to the second electrode of the second transistor T2 and the first storage electrode of the storage capacitor Cst. The third transistor T3 has the n-type transistor characteristic, and is turned on when a voltage control signal GRn of high voltage is applied to the gate electrode. When the third transistor T3 is turned on, the reference voltage Vref from the reference voltage line 176 may be transferred to the first storage electrode of the storage capacitor Cst and the gate electrode of the driving transistor T1.

The fourth transistor T4 includes a gate electrode connected to the initialization control line 153, a first electrode connected to the initialization voltage line 127, and a second electrode connected to the second storage electrode of the storage capacitor Cst. The second electrode of the fourth transistor T4 is also connected to the second electrode of the driving transistor T1 and the anode of the organic light emitting diode OLED. The fourth transistor T4 has the n-type transistor characteristic, and is turned on when an initialization control signal GIn of high voltage is applied to the gate electrode. When the fourth transistor T4 is turned on, the initialization voltage Vint from the initialization voltage line 127 may be transferred to the second storage electrode of the storage capacitor Cst, the anode of the organic light emitting diode OLED, and the second electrode of the driving transistor T1.

The fifth transistor T5 includes a gate electrode connected to the light emitting control line 154, a first electrode connected to the driving voltage line 175, and a second electrode connected to the first electrode of the driving transistor T1. The fifth transistor T5 has a p-type transistor characteristic, and is turned on when a light emitting control signal EMn of a low voltage is applied to the gate electrode. When the fifth transistor T5 is turned on, the driving voltage ELVDD from the driving voltage line 175 may be transferred to the first electrode of the driving transistor T1.

Some transistors among the plurality of transistors T1, T2, T3, T4, and T5 included in the pixel PX have the n-type transistor characteristic in which the semiconductor layer is formed as an oxide semiconductor, and the remaining transistors have the p-type transistor characteristic in which the semiconductor layer is formed as a polycrystalline semiconductor. Hereinafter, the transistor including the oxide semiconductor is referred to as an oxide semiconductor transistor, and the transistor including the polycrystalline semiconductor is referred to as a polycrystalline semiconductor transistor.

In the display device according to an exemplary embodiment of the inventive concept, the driving transistor T1, the second transistor T2, the third transistor T3, and the fourth transistor T4 are 'the oxide semiconductor transistor', and the fifth transistor T5 is 'the polycrystalline semiconductor transistor'. However, it is not limited thereto, and it is possible that the driving transistor T1, the second transistor T2, the third transistor T3, and the fourth transistor T4 are 'the polycrystalline semiconductor transistor', and the fifth transistor T5 is 'the oxide semiconductor transistor'.

The storage capacitor Cst includes the first electrode connected to the gate electrode of the driving transistor T1 and the second electrode connected to the second electrode of the first transistor T4. The first storage electrode of the storage capacitor Cst is also connected to the second electrode of the second transistor T2 and the second electrode of the third transistor T3. The storage capacitor Cst may store the data voltage DATA supplied through the second transistor T2. The data voltage DATA stored in the storage capacitor Cst adjusts the degree to which the driving transistor T1 turns on to determine the magnitude of the driving current.

The organic light emitting diode OLED includes the anode connected to the second electrode of the driving transistor T1 and the cathode to which the common voltage ELVSS is applied. The organic light emitting diode OLED emits light according to the driving current output from the driving transistor T1 to express a gray.

Hereinafter, an operation of one pixel of the display device according to an exemplary embodiment of the inventive concept, which is divided into an initialization period, a threshold voltage storage period, a data writing period, and a light emitting period, is described with reference to FIG. 6.

Referring to FIG. 6, during the initialization period, the initialization control signal GIn and the voltage control signal GRn have an on voltage level, and the light emitting control signal EMn and the gate signal GWn have an off voltage level. Thus, the third transistor T3 and the fourth transistor T4 are turned on, and the second transistor T2 and the fifth transistor T5 are turned off. The reference voltage Vref is applied to the first storage electrode of the storage capacitor Cst and the gate electrode of the driving transistor T1, and the initialization voltage Vint is applied to the second storage electrode of the storage capacitor Cst, the second electrode of the driving transistor T1, and the anode of the organic light emitting diode OLED to initialize the driving transistor T1.

Next, during the threshold voltage storage period, the light emitting control signal EMn and the voltage control signal GRn have the on voltage level, and the initialization control signal GIn and the gate signal GWn have the off voltage level. As a result, the third transistor T3 and the fifth transistor T5 are turned on, and the second transistor T2 and the fourth transistor T4 are turned off. The reference voltage Vref is applied to the first storage electrode of the storage capacitor Cst and the gate electrode of the driving transistor T1. In this case, an output side voltage of the driving transistor T1 is stored to the second storage electrode of the storage capacitor Cst. The output side voltage of the driving transistor T1 has a value obtained by subtracting a threshold voltage Vth from the reference voltage Vref which is the voltage of the gate electrode. Since the first storage electrode voltage of the storage capacitor Cst is the reference voltage Vref, a voltage difference between both electrodes of the storage capacitor Cst has a value of the threshold voltage Vth. Additionally, since the value of Vref-Vth is set to be lower than the common voltage ELVSS, it may be set so that the current does not flow to the organic light emitting diode OLED. For example, the reference voltage Vref may be about 1 V.

Next, during the data writing period, the gate signal GWn has the on voltage level, and the light emitting control signal EMn, the initialization control signal Gin, and the voltage control signal GRn have the off voltage level. Thus, the second transistor T2 is turned on, and the third transistor T3, the fourth transistor T4, and the fifth transistor T5 are turned off. In this case, the data voltage DATA is applied to the first storage electrode of the storage capacitor Cst and the gate electrode of the driving transistor T1, the data voltage DATA is applied to the first storage electrode of the storage capacitor Cst, and the voltage difference of both electrodes of the storage capacitor Cst is changed to a voltage (DATA+Vth).

Next, during the light emitting period, only the light emitting control signal EMn has the on voltage level, and the initialization control signal GIn, the voltage control signal GRn, and the gate signal GWn have the off voltage level. Thus, only the fifth transistor T5 is turned on and the first to fourth transistors T1 to T4 are turned off. The driving transistor T1 provides the output current based on the voltage (DATA+Vth) charged in the storage capacitor Cst, and the provided output current is proportional to the square of (Vgs-Vth). Since Vgs has the value of (DATA+Vth-ELVDD), the threshold voltage Vth is offset such that the output current, independent of the threshold voltage of the driving transistor T1, is output to the organic light emitting diode OLED. The organic light emitting diode OLED emits light depending on the output current.

Figure 7:
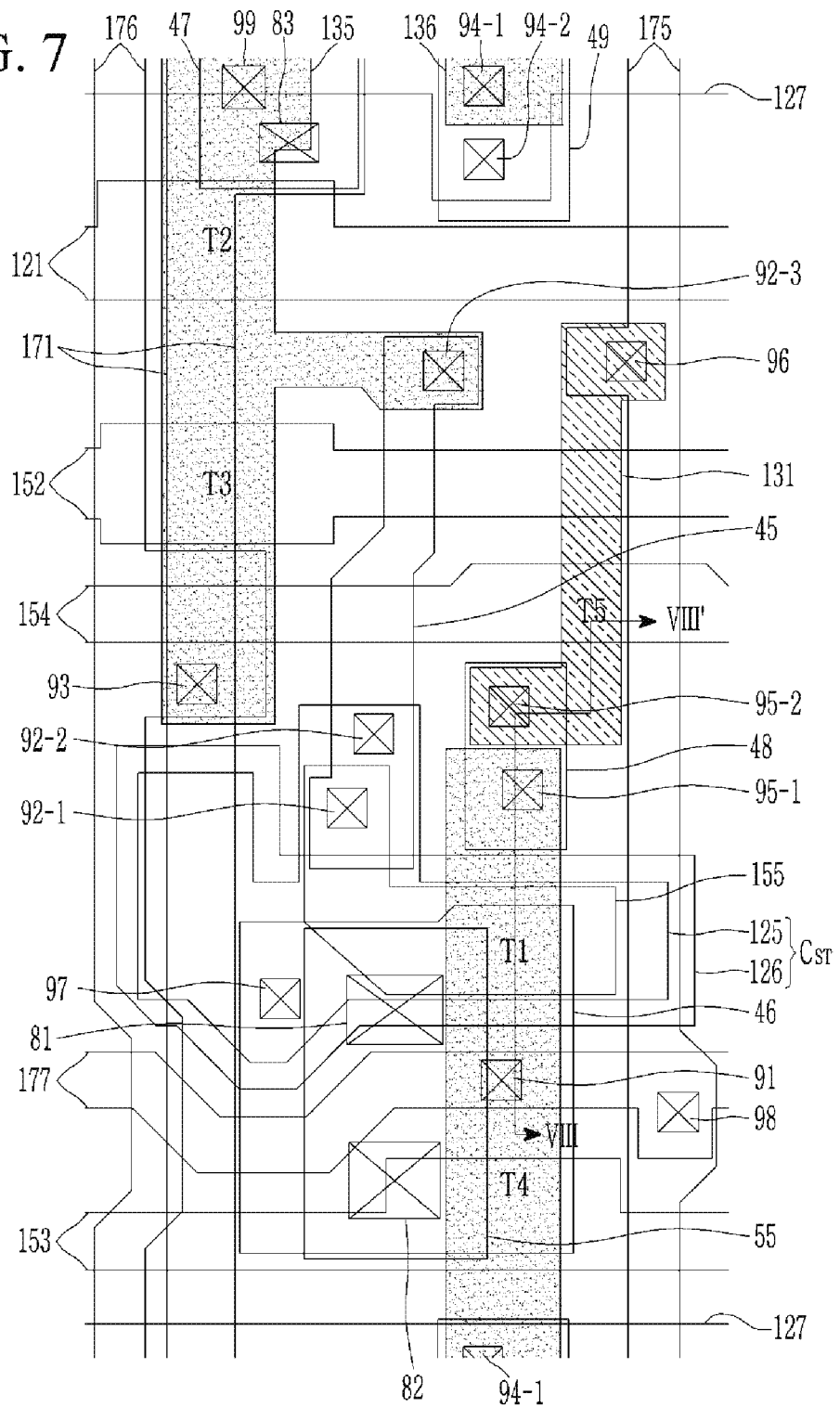
FIG. 7 is a layout view of one pixel area of a display device according to an exemplary embodiment of the inventive concept.
Figure 8:
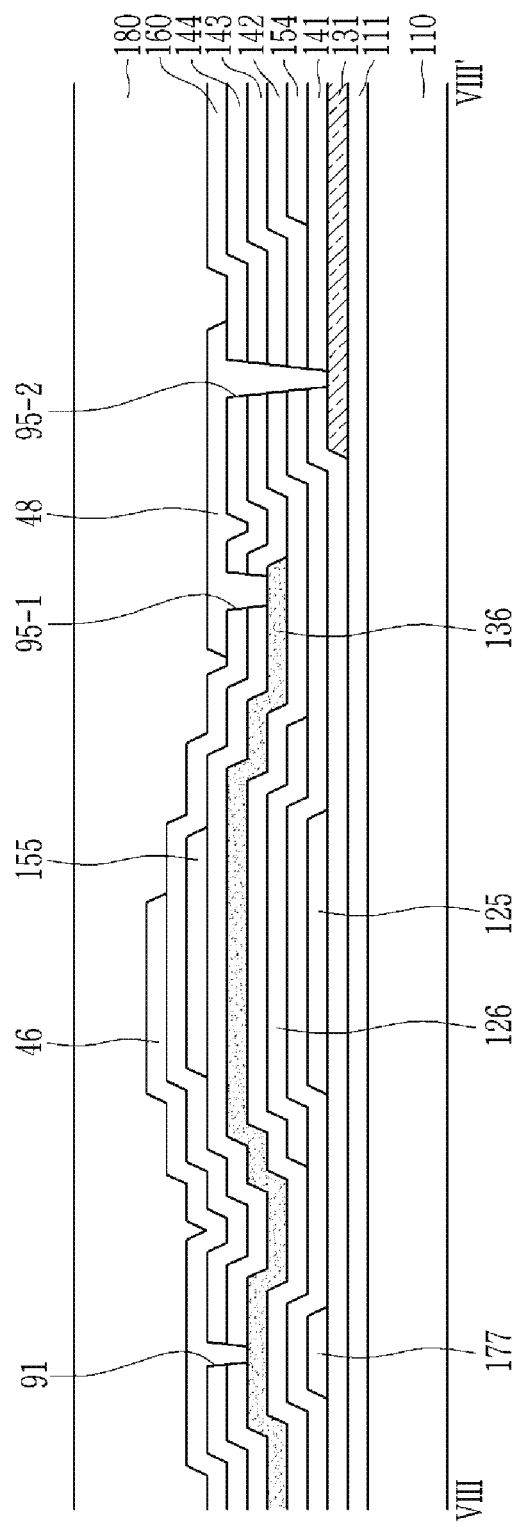
FIG. 8 is a cross-sectional view taken along a line VIII-VIII' of FIG. 7 according to an exemplary embodiment of the inventive concept.

FIG. 7 is a layout view of one pixel area of a display device according to an exemplary embodiment of the inventive concept, and FIG. 8 is a cross-sectional view taken along a line VIII-VIII' of FIG. 7 according to an exemplary embodiment of the inventive concept.

Referring to FIG. 7, a display device according to an exemplary embodiment of the inventive concept includes a plurality of signal lines and a plurality of transistors. The plurality of signal lines include the gate line 121, the voltage control line 152, the light emitting control line 154, an auxiliary driving voltage line 177, the initialization control line 153, and the initialization voltage line 127, extending in a first direction (a horizontal direction), and include the reference voltage line 176, the data line 171, and the driving voltage line 175, extending in a second direction (a vertical direction) crossing the first direction.

The gate line 121 transmits the gate signal, the voltage control line 152 transmits the voltage control signal GRn, and the light emitting control line 154 transmits the light emitting control signal EMn. The auxiliary driving voltage line 177 transmits the driving voltage ELVDD and the initialization voltage line 127 transmits the initialization voltage Vint.

The reference voltage line 176, the data line 171, and the driving voltage line 175 transmit the reference voltage Vref, the data voltage DATA, and the driving voltage ELVDD, respectively. The auxiliary driving voltage line 177 extends in the first direction across the driving voltage line 175 extending in the second direction, and is connected to the driving voltage line 175 through an opening 98. The auxiliary driving voltage line 177 extending in the first direction is included as well as the driving voltage line 175 extending in the second direction, to prevent a voltage drop.

The plurality of transistors T1, T2, T3, T4, and T5 are formed along a shaded semiconductor layer. The semiconductor layer includes a polycrystalline semiconductor layer 131 and oxide semiconductor layers 135 and 136. As described above, the driving transistor T1, the second transistor T2, the third transistor T3, and the fourth transistor T4 may include the oxide semiconductor layers 135 and 136, and the fifth transistor T5 may include the polycrystalline semiconductor layer 131.

The polycrystalline semiconductor layer 131 and the oxide semiconductor layers 135 and 136 may extend substantially in the second direction. However, they are not limited to this, and it is possible to have various shapes and to have a curved shape.

The driving transistor T1 includes a gate electrode 155, a channel, a first electrode, and a second electrode. The channel of the driving transistor T1 is disposed at a first oxide semiconductor layer 136 overlapping the gate electrode 155 of the driving transistor T1 in a plan view, and the first electrode and the second electrode are disposed on respective sides of the channel in the first oxide semiconductor layer 136.

The gate electrode 155 of the driving transistor T1 is island-shaped, and is connected to one end of a first connection member 45 through an opening 92-1. One end of first connection member 45 is connected with a first storage electrode 125 of the capacitor Cst through an opening 92-2. The other end of the first connection member 45 is connected to the second electrode of the second transistor T2 and the third transistor T3 through an opening 92-3. The first electrode of the driving transistor T1 is electrically connected to a fourth connection member 48 through an opening 95-1, and the fourth connection member 48 is connected to the second electrode of the fifth transistor T5 through an opening 95-2. The second electrode of the driving transistor T1 is connected to a second connection member 46 through an opening 91, the second connection member 46 is connected to a sixth connection member 55 through an opening 82, and the sixth connection member 55 is electrically connected to the anode of the organic light emitting diode through an opening 81.

The second transistor T2 includes a gate electrode, a channel, a first electrode, and a second electrode. The gate electrode of the second transistor T2 may be a partial region of the gate line 121. The channel of the second transistor T2 is disposed in the second oxide semiconductor layer 135 overlapping the gate electrode of the second transistor T2 in a plan view, and the first electrode and the second electrode are disposed at respective sides of the channel in the second oxide semiconductor layer 135.

The first electrode of the second transistor T2 is electrically connected to a third connection member 47 through an opening 99, and the third connection member 47 is electrically connected to a protruded portion of the data line 171 through an opening 83. The second electrode of the second transistor T2 is connected to the first connection member 45 through the opening 92-3. The second electrode of the second transistor T2 is also connected to a second electrode of the third transistor T3.

The third transistor T3 includes a gate electrode, a channel, a first electrode, and a second electrode. The gate electrode of the third transistor T3 may be a partial region of the voltage control line 152. The channel of the third transistor T3 is disposed in the second oxide semiconductor layer 135 which overlaps the gate electrode of the third transistor T3 in a plan view, and the first and second electrodes are disposed on respective sides of the channel in the second oxide semiconductor layer 135. The first electrode of the third transistor T3 is electrically connected to a protruded portion of the reference voltage line 176 through an opening 93.

The fourth transistor T4 includes a gate electrode, a channel, a first electrode, and a second electrode. The gate electrode of the fourth transistor T4 may be a partial region of the initialization control line 153. The channel of the fourth transistor T4 is disposed in the first oxide semiconductor layer 136, which overlaps the gate electrode of the fourth transistor T4, and the first electrode and the second electrode are disposed on respective sides of the channel in the first oxide semiconductor layer 136.

The first electrode of the fourth transistor T4 is electrically connected to a fifth connection member 49 through an opening 94-1, and the fifth connection member 49 is electrically connected to a protruded portion of the initialization voltage line 127 through an opening 94-2. The second electrode of the fourth transistor T4 is connected to the second electrode of the driving transistor T1, and is also electrically connected to the second connection member 46 through the opening 91.

The fifth transistor T5 includes a gate electrode, a channel, a first electrode, and a second electrode. The gate electrode of the fifth transistor T5 may be a partial region of the light emitting control line 154. The channel of the fifth transistor T5 is disposed in the polycrystalline semiconductor layer 131 which overlaps the gate electrode of the fifth transistor T5, and the first electrode and the second electrode are disposed on respective sides of the channel in the polycrystalline semiconductor layer 131.

The first electrode of the fifth transistor T5 is electrically connected to a protruded portion of the driving voltage line 175 through an opening 96.

The storage capacitor Cst includes the first storage electrode 125 and a second storage electrode 126. The first storage electrode 125 and the second storage electrode 126 overlap in a plan view. The first storage electrode 125 is electrically connected to the first connection member 45 through the opening 92-2 and the second storage electrode 126 is electrically connected to the sixth connection member 55 through an opening 97.

Referring to FIG. 8, the display device according to an exemplary embodiment of the inventive concept includes the substrate 110.

The buffer layer 111 is disposed on the substrate 110. The buffer layer 111 may include a silicon oxide or a silicon nitride. The buffer layer 111 is interposed between the substrate 110 and the polycrystalline semiconductor layer 131 to block impurities diffused from the substrate 110 to the polycrystalline semiconductor layer 131, and may planarize the substrate 110 to smooth the stress of the polycrystalline semiconductor layer 131 formed on the buffer layer 111.

The polycrystalline semiconductor layer 131 of the polycrystalline semiconductor transistor is disposed on the buffer layer 111. The polycrystalline semiconductor layer 131 may be formed of polysilicon formed by crystallizing amorphous silicon by a crystallization method such as excimer laser annealing (ELA).

The lower gate insulating layer 140 and a lower gate conductive layer are disposed on the polycrystalline semiconductor layer 131. The lower gate insulating layer 140 may include the first gate insulating layer 141, the second gate insulating layer 142, and the third gate insulating layer 143, and the lower gate conductive layer may include a first gate conductive layer and a second gate conductive layer. However, without being limited thereto, the lower gate insulating layer 140 and the lower gate conductive layer may include fewer or more layers.

For example, the first gate insulating layer 141 is disposed on the polycrystalline semiconductor layer 131. The first gate insulating layer 141 may include a silicon oxide or a silicon nitride.

The first gate conductive layer is formed on the first gate insulating layer 141, and includes the gate electrode of the polycrystalline transistor, the light emitting control line 154, the initialization voltage line 127, and the first storage electrode 125 of the storage capacitor Cst.

The second gate insulating layer 142 is disposed on the first gate conductive layer. The second gate insulating layer 142 may include a silicon oxide or a silicon nitride.

The second gate conductive layer containing the second storage electrode 126 of the storage capacitor Cst is disposed on the second gate insulating layer 142.

The third gate insulating layer 143 is disposed on the second gate conductive layer. The third gate insulating layer 143 may include a silicon oxide or a silicon nitride.

The oxide semiconductor layers 135 and 136 are disposed on the lower gate insulating layer 140 and the lower gate conductive layer. In other words, the oxide semiconductor layers 135 and 136 including the first oxide semiconductor layer 136 and the second oxide semiconductor layer 135 are disposed on the third gate insulating layer 143. The first oxide semiconductor layer 136 and the second oxide semiconductor layer 135 are spaced apart from each other. The first oxide semiconductor layer 136 may include the channel in the region overlapping the gate electrodes of the driving transistor T1 and the fourth transistor T4. The second oxide semiconductor layer 135 may include the channel in the region overlapping the gate electrode of the second transistor T2 and the third transistor T3.

The upper gate insulating layer 144 (also referred to as the fourth gate insulating layer 144) and the upper gate conductive layer are disposed on the oxide semiconductor layers 135 and 136. In other words, the fourth gate insulating layer 144 is disposed on the oxide semiconductor layers 135 and 136, and the third gate conductive layer including the gate electrode of the driving transistor T1, the gate line 121, the voltage control line 152, and the initialization control line 153 is disposed on the fourth gate insulating layer 144. Referring to FIG. 4, the third gate conductive layer may also include the reference voltage supply line 60 and the reference voltage connection line 61 of the non-display area NA.

The interlayer insulating layer 160 is disposed on the third gate conductive layer. The interlayer insulating layer 160 may include an inorganic insulating material such as a silicon nitride, a silicon oxide, or a silicon oxynitride.

The first data conductive layer including the first connection member 45, the second connection member 46, the third connection member 47, the fourth connection member 48, the fifth connection member 49, and the reference voltage line 176 is disposed on the interlayer insulating layer 160. Referring to FIG. 4, the first data conductive layer may also include the driving voltage supply line 50 and the driving voltage connection line 51 of the non-display area NA. The interlayer insulating layer 160, the fourth gate insulating layer 144, the third gate insulating layer 143, the second gate insulating layer 142, and the first gate insulating layer 141 include the opening for connecting the first data conductive layer formed on the interlayer insulating layer 160 to another conductive layer or the semiconductor layer.

The passivation layer 180 is disposed on the first data conductive layer. The passivation layer 180 includes an organic insulating material, thus planarizing the first data conductive layer.

The second data conductive layer including the sixth connection member 55 and the data line 171 is disposed on the passivation layer 180. Referring to FIG. 3, the second data conductive layer may include the initialization voltage supply line 40, the initialization voltage connection line 41, and the gate signal connection line 122 of the non-display area NA. The passivation layer 180 includes the opening for connecting the second data conductive layer and the first data conductive layer.

A planarization layer on the second data conductive layer may be further included, and the organic light emitting diode OLED may be disposed on the planarization layer.

The anode of the organic light emitting diode OLED is disposed on the planarization layer. The anode is connected to the sixth connection member 55 through the opening 81 formed in the planarization layer.

A partition may be disposed on the planarization layer and the anode. The partition has an open part overlapping the anode, and an organic emission layer is disposed in the open part. The cathode of the organic light emitting diode OLED may be disposed on the organic emission layer and the partition. The anode, the organic emission layer, and the cathode form the organic light emitting diode OLED. The positions of the anode and the cathode may be exchanged according to exemplary embodiments of the inventive concept. When holes and electrons are injected into the organic emission layer from the anode and the cathode, an exciton, which is formed by the injected holes and electrons, is emitted when being dropped from an excited state to a ground state.

According to exemplary embodiments of the inventive concept, spacing between the semiconductors of the transistors of the display device may be narrowed or overlapped, thus increasing a degree of design freedom.

Additionally, in the display device, since the signal supply line may extend to pixels disposed in the periphery part, luminance deterioration of some pixels may be prevented, luminance uniformity may be maintained, and display quality may be improved.

While the inventive concept has been described with reference to exemplary embodiments thereof, it is to be understood by those of ordinary skill in the art that various modifications in form and details may be thereto without departing from the spirit and scope of the inventive concept as set forth by the appended claims.

What is claimed is:

1. A display device comprising:
a substrate including a display area and a non-display area;
a reference voltage supply line disposed in the non-display area and configured to transmit a reference voltage; and
a driving voltage supply line disposed in the non-display area and configured to transmit a driving voltage,
wherein the reference voltage supply line includes a straight line part extending in a first direction and a curved line part extending from the straight line part to be bent, and
the curved line part of the reference voltage supply line is disposed along a periphery of the display area.

2. The display device of claim 1, further comprising:
a reference voltage connection line extending from the reference voltage supply line in a second direction crossing the first direction; and
a reference voltage line extending in the display area in the second direction,
wherein the reference voltage line is electrically connected to the reference voltage connection line through an opening.

3. The display device of claim 2, further comprising:
a driving voltage connection line extending from the driving voltage supply line in the second direction; and
a driving voltage line extending in the display area in the second direction,
wherein the driving voltage line is electrically connected to the driving voltage connection line through an opening.

4. The display device of claim 3, further comprising an oxide semiconductor transistor including an oxide semiconductor layer and a polycrystalline semiconductor transistor including a polycrystalline semiconductor layer.

5. The display device of claim 4, further comprising a driving transistor,
wherein the driving transistor is the oxide semiconductor transistor, and
a gate electrode of the driving transistor is disposed on the same layer as the reference voltage supply line.

6. The display device of claim 5, further comprising a flexible printed circuit substrate connected to the substrate,
wherein the reference voltage supply line and the driving voltage supply line are disposed between the flexible printed circuit substrate and the display area.

7. The display device of claim 6, further comprising:
a gate driver disposed in the non-display area;
an initialization voltage supply line extending in the non-display area in the second direction;
a gate signal output terminal connected to the gate driver; and
a gate signal connection line connected to the gate signal output terminal through an opening,
wherein the initialization voltage supply line is disposed on the same layer as the gate signal connection line.

8. The display device of claim 7, wherein
pixels adjacent to the curved line part of the reference voltage supply line are arranged in a stepped shape.

9. The display device of claim 8, wherein
the gate driver and the driving voltage supply line are bent in the same direction as the curved line part of the reference voltage supply line in a region adjacent to the curved line part of the reference voltage supply line.

* * * * *